May 29, 1962 E. J. SLOBODZINSKI 3,037,128

PASSIVE ELEMENT BINARY CIRCUIT GATE

Filed Dec. 23, 1957 2 Sheets-Sheet 1

INVENTOR
EDWIN J. SLOBODZINSKI

BY

Alvin J. Riddles
ATTORNEY 3,037,128

PASSIVE ELEMENT BINARY CIRCUIT GATE

Edwin J. Slobodzinski, Hopewell Junction, N.Y., assignor to International Business Machines Corporation, New York, N.Y., a corporation of New York Filed Dec. 23, 1957, Ser. No. 704,734
6 Claims. (Cl. 307—88.5)

This invention relates to binary gates for bistable circuits and particularly to binary gates containing no active element.

In Eccles-Jordan type cross-coupled bistable circuitry, switching from one stable state to another is generally performed by introducting a control signal to switch the state of the circuit at one of two control electrode inputs to the respective cross-coupled active elements of the circuit, such that a particular active element is turned On. It is frequently desired in the operation of these circuits that a gating circuit be provided which makes available a common terminal upon which may be impressed a series of single polarity pulses which will serve to alternately establish one and then the other of the two stable states of the circuit. This type of operation has come to be known in the art as binary type operation.

A primary object of this invention is to provide an improved passive element binary circuit gate.

Another object of this invention is to provide an improved high-speed binary gate.

A related object of this invention is to provide an improved high-speed binary gated bistable circuit.

These and other objects of this invention are achieved by providing a two branch reactive circuit wherein an inductive and a resistive element are placed between the output and the control electrodes of each active element of a cross-coupled bistable circuit and a capacitive and a resistive element are placed between a common input terminal and each control electrode so that each branch provides a different impedance to successive input signals applied to the common input terminal depending upon the stable state of the cross-coupled circuit.

Figure 1:
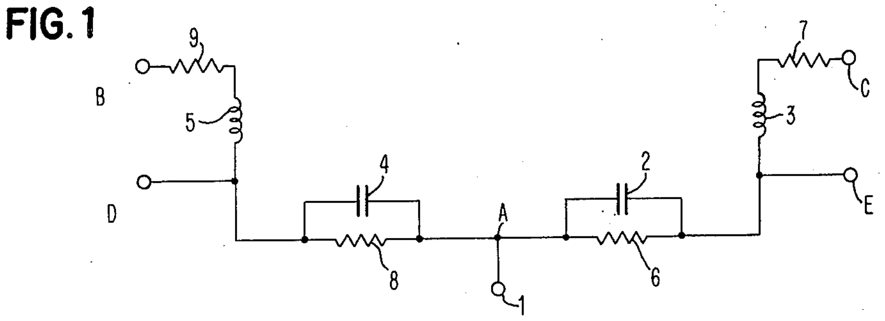
FIG. 1 is a diagram of the binary gate of this invention.

Referring now to FIG. 1, a schematic diagram of a binary gate of this invention is shown wherein only elements illustrating the principles of operation are included. The circuit comprises an input terminal 1 and two reactive branches comprising a capacitor 2 and an inductor 3 in series with a resistor 7 in one branch and a capacitor 4 and an inductor 5 in series with a resistor 9 in the other branch. Capacitors 2 and 4 are shunted by resistors 6 and 8, respectively. In operation, this circuit gate is provided with terminals lettered A, B, C, D and E for explanation purposes, to be later included. The terminals connected to the circuit between the inductor and the capacitor, in each branch, are to be connected to the respective control electrodes of the two active elements of a cross-coupled bistable circuit and the terminals connected to the ends of the inductive elements are designed to be connected to the output electrodes of the two active elements of the bistable circuit.

The application of the binary gate of this invention serves to cause a cross-coupled Eccles-Jordan type bistable circuit to which it is applied to be responsive in changing states to successive pulses of the same polarity applied to the input terminal 1. In operation, voltage changes at points B and C, such as would take place as a result of a change in stable state of the circuit are confronted with a high impedance represented by inductors 3 and 5 and shunted through capacitors 2 and 4 to a low impedance driver connected to terminal 1. The result of this is that the path from points C to E or B to D acts as a low pass filter for voltage changes appearing at the outputs of the active elements of the bistable circuit. When a voltage change is applied at the input terminal 1, it is immediately coupled to the control electrodes of the active elements of the bistable circuit which are connected at points D and E through a low impedance path consisting of capacitors 2 and 4. At this point, the inductive elements 3 and 5 provide a high impedance for this signal so that looking into the circuit from the input terminal 1, the path from A to D or A to E is seen as a high-pass filter. Since the bistable circuit to which this gate is attached will be in one of two stable states, then points B and C will be at different levels and therefore different voltage levels will be presented to the control electrodes in each of the two reactive branches depending upon the stable state of the circuit. The resistive impedance in the binary gate is so arranged that a voltage divider action takes place between points B and C and A such that only the active element on the Off side of the bistable circuit is at a D.C. bias such that the input voltage change applied to terminal 1 is sufficient to turn it On.

Figure 2:
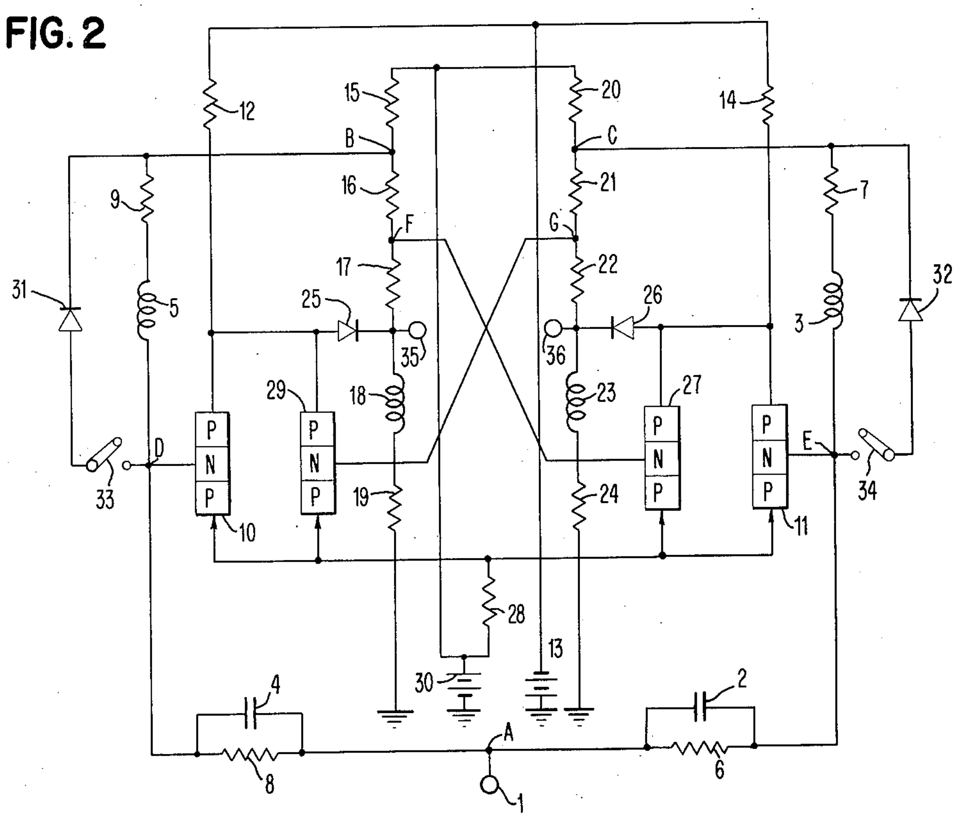
FIG. 2 is a diagram of a binary gated cross-coupled bistable circuit illustrating this invention.

Referring now to FIG. 2, a transistor Eccles-Jordan type cross-coupled bistable circuit is shown wherein the passive element binary gate, described in connection with FIG. 1, is employed to provide binary operation. In the bistable circuit of FIG. 2, the same elements and points in the circuit, described in connection with FIG. 1, have been given identical reference indicia. The bistable circuit is made up of two cross-coupled active elements, illustrated as transistors 29 and 27, each having its emitter supplied from a constant current source, shown as battery 30 and resistor 28, in series. Transistor 29 is provided with a pullover active element, shown as transistor 10, having its emitter connected to the emitter of transistor 29 and its collector connected to the collector of transistor 29. Similarly, transistor 27 is provided with a pullover transistor 11 having its emitter connected to the emitter of transistor 27 and its collector connected to the collector of transistor 27. A load impedance is provided for transsistors 29 and 10 and is illustrated as resistor 12, returned to a power and bias source, illustrated as battery 13. Similarly, a load impedance 14 is provided for transistors 27 and 11 and returned to battery 13. Two, series, voltage division branches, are provided comprising in the case of the side of the bistable circuit involving transistor 29, a path from battery 30 through resistors 15, 16, 17, inductor 18 and resistor 19, in series to a reference potential and for the side of the bistable circuit involving active element 27, the series path comprises resistors 20, 21, 22, inductor 23 and resistor 24, in series between battery 30 and reference potential. Base potential for transistor 27 is cross-coupled to point F between resistors 16 and 17 and similarly, the base of transistor 29 is coupled to point G between resistors 21 and 22. The collector of transistor 29 is coupled to the point between inductor 18 and resistor 17 through diode 25 and similarly, the collector of transistor 27 is coupled to the point between inductor 23 and resistor 22 through diode 26. Diodes 31 and 32 may be connected between points B and D and C and E, respectively, by closing switches 33 and 34 for recovery time improvements, to be later described. In order to aid in understanding and practicing the invention, the following set of specifications for the circuit of FIG. 2, is provided. It should be understood that the following set of specifications should not be construed as a limitation since it is well known in the art that wide ranges of individual specifications are available for a particular circuit configuration.

| | |
|---|---|
| Transistors 29, 27, 10 and 11 | PNP frequency cut off 5 megacycles—Alpha greater than .97—emitter to base breakdown voltage greater than 1.5 volts. |
| Diodes 25, 26 | Zener diodes $V_z=6$ volts (for example, National Semiconductor 1N468 or equivalent). |
| Diodes 31, 32 | Forward resistance 20 ohms, back resistance 5 megohms (for example, Sylvania 1N41 or equivalent). |
| Batteries 30, 13 | 42 volts. |
| Resistors 12 and 14 | 4,700 ohms. |
| Resistors 15 and 20 | 8,200 ohms. |
| Resistors 16 and 21, 17 and 22 | 62 ohms. |
| Resistors 19 and 24 | 220 ohms. |
| Inductors 18 and 23 | 1.5 microhenries. |
| Inductors 5 and 3 | 15 microhenries. |
| Resistors 7 and 9 | 10,000 ohms. |
| Resistor 28 | 6,200 ohms. |
| Resistors 6 and 8 | 22,000 ohms. |

In operation, transistors 29 and 27 have their respective bases coupled to points G and F and comprise an Eccles-Jordan type bistable circuit. The outputs of transistors 29 and 27 are connected through voltage level translating devices shown as diodes 25 and 26 to output terminals 35 and 36. The potential level swing at the outputs 35 and 36 swings normally plus or minus 0.6 volt. Similarly, the input signal swing at terminal 1 is plus or minus 0.6 volt.

It will be apparent from the table of specifications supplied with this circuit that since the combination of battery 30 and the large impedances of resistors 15 and 20 comprise an essentially constant current source, it will be possible to design the circuits so that the output signal swing at terminals 35 and 36 may swing at something other than zero. Points F and G are designed to vary between —0.3 to +0.9 volt and points B and C are designed to swing normally from zero to +1.2 volts. Since the bases of transistors 29 and 27 are connected to points F and G and since the emitters of both transistors 29 and 27 are supplied from the same source, the value of resistor 28 is designed such that the transistor whose base is —0.3 volt is conducting and the transistor whose base is +0.9 volt is cut off. The function of transistors 10 and 11 is that of pullover elements since battery 30 and resistor 28 comprise a constant current source for the emitters of transistors 29, 27, 10 and 11, all of which are returned to battery 13 through resistors 12 and 14 both of the same magnitude.

It will be apparent that if any one of transistors 27, 29, 10 or 11 is more heavily biased, current flow will be initiated through that transistor and the remaining three will be cut off, this, if an input signal is introduced into the base of transistor 10 or 11, that transistor in being turned On will turn Off the particular transistor associated with the stable state of the bistable circuit and the cross-coupling from points F and G will be such as to turn On the opposite active element at the end of the pulse time. The purpose of diodes 25 and 26 is to employ the constant voltage portion of the characteristic to provide a shift in potential level at output terminals 35 and 36 for compatibility in coupling with other logical stages as is well known in the computer art. This technique of voltage translation is described and claimed in copending application Serial No. 704,040 filed December 20, 1957, and assigned to the assignee of this application.

As a result of the application of the binary gate of FIG. 1 in the bistable circuit of FIG. 2, the circuit is rendered operable to change stable state from one state to the other in a binary manner; namely, in response to pulses of one polarity applied to terminal 1. The gate in the embodiment of FIG. 2 is composed of resistors 7 and 9 to points B and C in series with inductors 3 and 5 between the bases of the pullover transistors. Two series resistors are used and are connected between the input terminal 1 and the bases of the pullover transistors, these resistors are shunted by capacitors 2 and 4. When the source of pulses applied to terminal 1 is a low impedance such as for example, a transistor emitter follower circuit, well known in the semiconductor art, voltage changes at points B or C are coupled to the bases of the pullover transistors through a high impedance and the respective bases are by-passed by the capacitors 2 and 4 to the low impedance driver. Hence, the path from B to D or from C to E acts as a low pass filter to potential changes appearing in the load of the active elements so that, in effect, these potential changes while they operate to provide cross-coupling from points F and G to the respective bases of the active elements 29 and 27 still are shunted to the low impedance driver by the construction of the gating circuit. At the same time, the resistors in the binary gate; namely, the resistors 6, 7, 8 and 9 are so designed, that a voltage division takes place between points B and C and A such that since with one of the two active elements 29 or 27 conducting, either point B or point C will be at a lower potential level and the other one will be at a higher one. The values of resistors 6, 7, 8 and 9 are so chosen that only the pullover transistor 10 or 11 is at a D.C. bias such that the input voltage change applied to terminal 1 is sufficient to turn it On.

Figure 3:
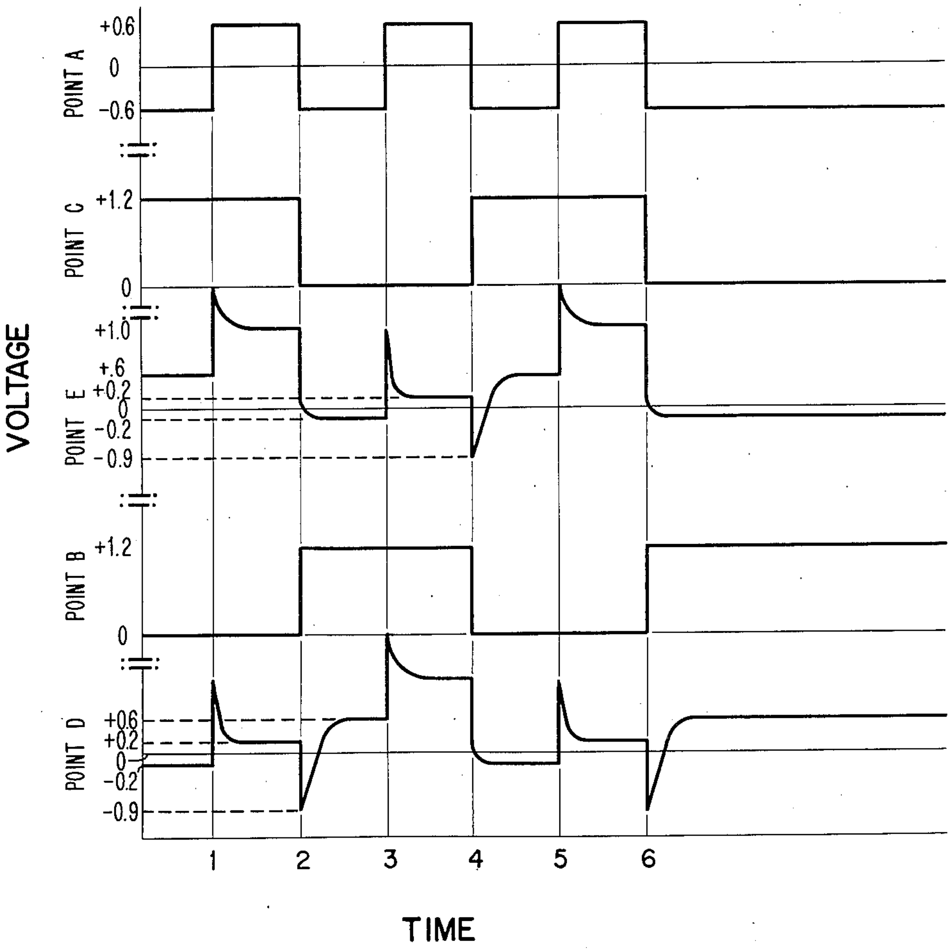
FIG. 3 is a timing chart illustrating the operation of the circuit of FIG. 2.

Referring now to FIG. 3, a timing chart is shown illustrating the changes in level at the points in the circuit which control the particular stable state of the circuit of FIG. 2. The timing chart of FIG. 3 is plotted with voltage as the ordinate and time as an abscissa for each of the control points of the circuit of FIG. 2. The voltage values given are those compatible with the table of circuit specifications given in connection with FIG. 2. The first curve represents a series of successive pulses of the same polarity varying from —0.6 volt to +0.6 volt as would be applied at terminal 1 and would appear at point A in the circuit of FIG. 2. The second curve represents the variation in signal level at point C in the circuit, it is dependent on the current flowing through the load branches wherein points B and C appear and it may be seen that the curve representing point B traverses the same signal level swings as the curve representing point C at alternate time cycles. In comparing the curves describing the potential excursions at points E and D with the circuit of FIG. 2, it will be seen that at terminal 1 the input goes positive, raising point A to +0.6 volt. At this time, transistor 27 is conducting so that the potential level at point C is at +1.2 volts whereas the potential level at point B is at 0 volts. The input signal applied to terminal 1 is coupled as a transient through capacitors 2 and 4 raising the potential at both points D and E. Since point C is at the more positive of the two levels, the potential level at point E is +0.6 volt whereas the potential level at point D being coupled through resistor 28 to point B is at —0.2 volt. This potential rise is ineffective with respect to this conductivity type transistor to turn On either transistor 10 or 11 and the on-going transient ends with point E at +1.0 volt and point D at +0.2 volt. When the input signal applied to point A goes negative from +0.6 to —0.6 at time 2, a sharp drop in potential appears at both points D and E. At point E, since the base of transistor 11 is already sitting at +1.0 volt, this drop in potential is not sufficient to overcome the reverse bias on the transistor. The drop goes down to —0.2 which is not sufficient to turn On transistor 11. The same shift however, when coupled to point D of the base of transistor 10 which, the stable state of the circuit, the base of transistor 10, being at +0.2 volt now goes sufficiently far negative to turn On transistor 10 which, in turn, in its pullover type operation leaves transistor 29 On after the transient. Transistor 10 in going On carries all the current supplied to the emitters of the four transistors so that transistors 27, 29 and 11 are momentarily cut off. The turning Off of transistor 27 reduces the current through the load branch including point G so that the cross-coupling holds the base of transistor 29 negative maintaining it On at the end of the input signal. Point E now rests at +0.2 volt and point D now rests at +0.6 volt. The positive transient associated with the input signal going positive at the beginning of time 3 is once again ineffectual when applied to points D and E, other than to further reverse bias the base of transistor 10. At time 4, when the input signal again goes negative, point D is sufficiently positive being connected to the On side of the circuit that transistor 10 is not turned On whereas at point E the base of transistor 11 is pulled negative to −0.9 volt which is sufficient to turn On the transistor 11. The turning On of transistor 11 leaves transistor 27 On after the transient so that the potential level at point C rises as shown in the curve accompanying it and the potential level at point B drops indicating a change in stable state of the circuit. When the negative pulse at the end of time 5 goes positive, once again a difference in potential levels at point D and point E are established so that a subsequent negative input pulse at time 6 operates to turn On the pullover transistor associated with the Off side of the circuit which is in this case transistor 10.

As may be seen from the above description, in each instance the respective base of the pullover transistor connected to the Off side of the circuit is biased slightly above threshold when the input is at its most negative level. When the input goes to the more positive level, the base moves quite positive during the input transient but later settles down to a value representing slightly positive bias, when the input goes to its negative excursion representing a subsequent negative input pulse, the base of the transistor connected to the Off side of the circuit goes quite negative during the transient turning On that pullover transistor and turning Off the conducting active element transistor. The positive swing at points C and B is prevented from affecting the potential at points B and E during the transient by the action of the binary gating network behaving as a high-pass filter, as previously described. The above described circuit under the specifications recited in connection with FIG. 2 operates in the vicinity of 1 megacycle frequency response and a factor of 10 increase in performance may be acquired through the expedient of closing switches 33 and 34 thereby connecting asymmetric impedances 31 and 32 across resistor 9 and inductance 5, in series and resistor 7 and inductance 3, in series, respectively. The function of diodes 31 and 32 in the back impedance direction is to permit the combination of inductance and resistance between the respective bases of transistors 10 and 11 and points B and C in the circuit to perform its high-pass filter function and in the forward direction to dissipate transients stored in capacitances 2 and 4 more rapidly.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. In an Eccles-Jordan type bistable circuit having two cross-coupled active elements, each active element having an input, a control, and an output terminal, a binary circuit gate comprising an input terminal and two branches, each branch comprising capacitive reactance and resistance directly coupled between said input terminal and each said control terminal of said active elements and each said branch further comprising inductive reactance and resistance directly connected between said output terminal and said control terminal of each said active element.

2. The binary circuit gate of claim 1 wherein each of said active elements comprises at least one transistor.

3. The binary circuit gate of claim 2 wherein said active elements are PNP transistors.

4. A gated binary bistable circuit comprising, in combination, first and second active transistors and first and second pullover transistors, a source of constant current, means connecting the emitters of each of said first and second active transistors and said first and second pullover transistors to said source of constant current, a first load branch, a first source of power having one terminal thereof connected to reference potential, means connecting the collectors of said first active and said first pullover transistors through said first load branch to the remaining terminal of said first power source, a second load branch, means connecting the collectors of said second active and said second pullover transistors through said second load branch to said remaining terminal of said first power source, a second power source having one terminal connected to reference potential, a first voltage divider branch comprising a first, a second, a third and a fourth impedance, respectively, in series between reference potential and the remaining terminal of said second power source having a polarity opposite to said remaining terminal of said first power source, a second voltage divider branch comprising a first, a second, a third and a fourth impedance, respectively, in series between reference potential and said remaining terminal of said second power source, means coupling the base connection of said first active transistor to a point in said second voltage divider branch between said second and said third series impedances, means coupling the base connection of said second active transistor to a point in said first voltage divider between said second and said third series impedances, means coupling the collectors of each said first and second active transistors to a point in each said first and second voltage divider branch between said third and said fourth series impedance elements, a first inductance, a first gate resistance, means connecting said first inductance and said first gate resistance, in series, between the base of said first pullover transistor and a point in said first voltage divider branch between said first and said second series impedances, a second inductance, a second gate resistance, means coupling said second inductance and said second gate resistance, in series, between the base of said second pullover transistor and a point in said second voltage divider branch between said first and second series impedances, an input terminal, a third gate resistor connected between said input terminal and the base connection of said first pullover transistor, a first capacitor connected in parallel with said third gate resistor, a fourth gate resistor connected between said input terminal and the base connection of said second pullover transistor and a second capacitor connected in parallel with said fourth gate resistor.

5. The gated binary circuit of claim 4 wherein said transistors are PNP type junction transistors.

6. In an Eccles-Jordan type circuit including first and second active stages each stage having at least an input, an output and a control terminal the output terminal of each active stage being cross coupled to the control terminal of the other active stage, a binary circuit gate comprising in combination, a first terminal and first and second branches said first branch including a first resistor having one terminal thereof connected to said first terminal, a first branch terminal directly connected to the control electrode of said first active stage, means connecting the remaining terminal of said first resistor to said first branch terminal, a first capacitor having one terminal thereof connected to said first terminal, means connecting the remaining terminal of said first capacitor to said first branch terminal, a first inductive reactance, a second branch terminal directly connected to the output terminal of said first active stage and means connecting said inductive reactance between said first branch terminal and said second branch terminal, said second branch including a second resistor having one terminal thereof connected to said first terminal, a third branch terminal directly connected to the control terminal of said second active stage, means connecting the remaining terminal of said second resistor to said third branch terminal, a second capacitor having one terminal thereof connected to said first terminal, means connecting the remaining terminal of said second capacitor to said third branch terminal, a second inductive reactance, a fourth branch terminal directly connected to the output terminal of said second active stage and means connecting said inductive reactance in series between said third branch and said fourth branch terminal.

References Cited in the file of this patent

UNITED STATES PATENTS

| | | |
|---|---|---|
| 2,272,070 | Reeves | Feb. 3, 1942 |
| 2,441,963 | Gray | May 25, 1948 |
| 2,491,387 | Miller | Dec. 13, 1949 |
| 2,545,924 | Johnstone | Mar. 20, 1951 |
| 2,778,978 | Drew | Jan. 22, 1957 |
| 2,825,805 | Ziffer | Mar. 4, 1958 |
| 2,832,051 | Raisbech | Apr. 22, 1958 |
| 2,861,200 | Henle et al. | Nov. 18, 1958 |